United States Patent [19]

Aoshima et al.

[11] Patent Number: 4,920,310

[45] Date of Patent: Apr. 24, 1990

[54] VOLTAGE DETECTOR

[75] Inventors: Shinichiro Aoshima; Yutaka Tsuchiya, both of Shizuoka, Japan

[73] Assignee: Hamamatsu Photonics Kabushiki Kaisha, Shizuoka, Japan

[21] Appl. No.: 199,350

[22] Filed: May 26, 1988

[30] Foreign Application Priority Data

May 30, 1987 [JP] Japan .................................. 62-137317

[51] Int. Cl.$^5$ ...................... G01R 19/00; G01R 31/00; G02F 1/09
[52] U.S. Cl. ...................................... 324/96; 350/356; 350/374
[58] Field of Search ................... 324/96, 117 R, 77 K; 350/356, 374, 376; 356/368; 250/227

[56] References Cited

U.S. PATENT DOCUMENTS

| | | | |
|---|---|---|---|
| 4,253,061 | 2/1981 | Toshiharu et al. | 324/96 |
| 4,334,781 | 6/1982 | Ozeki | 356/368 |
| 4,446,425 | 5/1984 | Valdmanis et al. | 324/77 K |
| 4,603,293 | 7/1986 | Mourou et al. | 324/96 |
| 4,629,323 | 12/1986 | Matsumoto | 356/368 |
| 4,812,767 | 3/1989 | Taketmoti | 324/96 |

FOREIGN PATENT DOCUMENTS

| | | |
|---|---|---|
| 0197196 | 10/1986 | European Pat. Off. |
| 3326755A | 2/1984 | Fed. Rep. of Germany |
| 0137768 | 8/1983 | Japan .................................. 324/96 |

OTHER PUBLICATIONS

Valdmanis, J. A. et al., "Subpicosecond Electrooptic Sampling: Principles and Applications", IEEE JOURNAL OF QUANTUM ELECTRONICS, vol. qe–22, No. 1, pp. 69–78, Jan. 1986.

Valdmanis, J. A. et al., "Picosecond Electrooptic Sampling System", APPL. PHYS. LETT., vol. 41, No. 3, pp. 211–212, Aug. 1982.

Valdmanis, J. A. et al., "Subpicosecond Electrical Sampling", IEEE JOURNAL OF QUANTUM ELECTRONICS, vol. qe–19, No. 4, pp. 664–667, Apr. 1983.

Kolner, B. H. et al., "Electro-Optic Sampling with Picosecond Resolution", ELECTRONICS LETTERS, vol. 19, No. 15, pp. 574–575, Jul. 1983.

Tsuchiya, Y., "Advances in Streak Camera Instrumentation for the Study of Biological and Physical Processes", IEEE JOURNAL OF QUANTUM ELECTRONICS, vol. qe–20, No. 12, pp. 1516–1528, Dec. 1984.

Valdmanis, J. A., "High-Speed Optical Electronics: The Picosecond Optical Oscilloscope", SOLID STATE TECHNOLOGY/TEST AND MEASUREMENT WORLD, pp. S40-S44, Nov. 1986.

Valdmanis, J. A. et al., "Electro-Optic Sampling: Testing Picosecond Electronics Part 1. Principles and Embodiments", LASER FOCUS/ELECTRO-OPTICS, pp. 84–96, Feb. 1986.

Valdmanis, J. A. et al., "Electro-Optic Sampling: Testing Picosecond Electronics Part 2. Applications", LASER FOCUS/ELECTRO-OPTICS, pp. 96–106, Mar. 1986.

Valdmanis, J. A. et al., "Subpicosecond Electrical Sampling and Applications", PICOSECOND OPTO-ELECTRONIC DEVICES, pp. 249–270, 1984.

(List continued on next page.)

Primary Examiner—Ernest F. Karlsen
Attorney, Agent, or Firm—Finnegan, Henderson, Farabow, Garrett and Dunner

[57] ABSTRACT

A voltage detector detects a voltage developing in a selected area of an object such as an integrated circuit by utilizing an electro-optic material equipped in an optical probe. A change in refractive index of an electro-optic material which is caused by the voltage in the object, is detected as a change of polarization of a light beam passing through the electro-optic material. In order to avoid undesired changes of polarization of the light beam when passing through optical fibers, a polarizer, beam splitters, and an analyzer are assembled together and connected to the electro-optic material to form a compact optical probe.

8 Claims, 3 Drawing Sheets

OTHER PUBLICATIONS

Williamson, S. et al., "Picosecond Electro-Electron Optic Oscilloscope", PROC. CONF. PICOSECOND ELECTRON, OPTOELECTRON, pp. 58-61, (N.Y. Springer-Verlag), 1985.

Kolner, B. H. et al., "Electrooptic Sampling in GaAs Intergrated Circuits", IEEE JOURNAL OF QUANTUM ELECTRONICS, vol. qe-22, pp. 79-93, Jan. 1987.

Nees, J. et al., "Noncontact Electro-Optic Sampling with a GaAs Injection Laser", ELECTRONICS LETTERS, vol. 22, No. 17, pp. 918-919, Aug. 1986.

Sumitomo Denki Kogyo K.K. et al., "Light-Applying Voltage and Electric Field Sensor", PATENT ABSTRACTS OF JAPAN, vol. 6, No. 41, Mar. 13, 1982.

VOLTAGE DETECTOR

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong need exists in the art for detecting such rapidly changing voltage with high prevision without affecting the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by electron beams.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed in Japanese Patent Application No. 280498/1986 that voltage be detected by making use of the polarization of a light beam that changes with the voltage developing in a selected area of an object to be measured.

A voltage detector using this operating principle is schematically shown in FIG. 5. The detector generally indicated by 50 is composed of the following elements: an optical probe 52 connected to an optical fiber 51; a light source 53 in the form of a laser diode; a polarizer 54 that receives the light beam issuing from the light source 53 and which transmits only the portion that has a predetermined polarized component; a beam splitter 56 that splits the light beam from the polarizer 54 into two components, one of which is to be launched into the optical probe 52 while the other component is to be launched into a photoelectric converter 55; a beam splitter 59 that directs the input light from the beam splitter 56 toward the optical probe 52 while launching the input light from the probe 52 into an analyzer 57 and a photoelectric converter 58; a collimator 60 disposed between the beam splitter 59 and the optical fiber 51; and a comparator circuit 61 for comparing the electric signals produced from the photoelectric converters 55 and 58.

The optical probe 52 is filled with an electro-optic material 62 such as an optically uniaxial crystal of lithium tantalate ($LiTaO_3$). The tip 63 of the electro-optic material 62 is worked into a frustoconical shape. The optical probe 52 is surrounded with a conductive electrode 64 and has a coating of thin metal film 65 on its tip 63.

Voltage detection with the system shown in FIG. 5 starts with connection the conductive electrode 64 on the circumference of the optical probe 52 to a predetermined potential, say, the ground potential. Then, the tip 63 of the probe 52 is brought close to an object to be measured such as an integrated circuit (not shown), whereupon the thin metal film 65 coated on the tip 63 acquires a certain potential on account of a given voltage developing in the object to be measured. The difference between the potential of the thin metal film 65 and the ground potential to which the conductive electrode 64 is connected produces a change in the refractive index of the tip 63 of the electro-optic material 62. Stated more specifically, the difference between refractive indices for ordinary ray and extraordinary ray in a plane perpendicular to the optic axis will change in the optically uniaxial crystal.

The light beam issuing from the light source 53 is polarized by the polarizer 54 and a predetermined polarized component of intensity I is launched into the electro-optic material 62 in the optical probe 52 via beam splitters 56, 59, collimator 60 and optical fiber 51. Reference light produced by splitting with the beam splitter 56 has an intensity of I/2, and the input light that is launched into the electro-optic material 62 after being split with the beam splitters 56 and 59 has an intensity of I/4. As already mentioned, the refractive index of the tip 63 of the electro-optic material 62 varies with the potential of the thin metal film 65, so the input light launched into the electro-optic material 62 will experience a change in the state of its polarization at the tip 63 in accordance with the change in the refractive index of the latter. The light is then reflected from the thin metal film 65 and makes a return trip through the electro-optic material 62, from which it emerges and travels back through the optical fiber 51. If the length of the tip 63 of the electro-optic material 62 is written as l, the state of polarization of input light launched into that material will change in proportion to the difference between refractive indices for ordinary ray and extraordinary ray and to the length 2l as well. The output light sent back into the optical fiber 51 travels through the collimator 60 and beam splitter 59 and enters the analyzer 57. The intensity of the output light entering the analyzer 57 has been decreased to I/8 as a result of splitting with the beam splitter 59. If the analyzer 57 is designed in such a way as to transmit only an output light beam having a polarized component perpendicular to that extracted by the polarizer 54, the intensity of output light that is fed into the analyzer 57 after experiencing a change in the state of its polarization is changed from $I/8$ to $(I/8)\sin^2[(\pi/2)V/V_0]$ in the analyzer 57 before it is further fed into the photoelectric converter 58. In the formula expressing the intensity of output light emerging from the analyzer 57, V is the voltage developing in a selected area of an object to be measured, and $V_0$ is a half-wave voltage.

In the comparator circuit 61, the intensity of reference light produced from the photoelectric converter 55, or $I/2$, is compared with the intensity of output light produced from the other photoelectric converter 58, or $(I/8)\sin^2[(\pi/2)V/V_0]$.

The intensity of output light, or $(I/8)\sin^2[(\pi/2)V/V_0]$, will vary with the change in the refractive index of the tip 63 of the electro-optic material 62 that occurs as a result of the change in the potential of the thin metal film 65 coated on the tip 63 of the optical probe 52. Therefore, this intensity can be used as a basis for detecting the potential of the thin metal film 65, or the voltage developing in a selected area of an object to be measured, say, an integrated circuit.

As described above, in using the voltage detector 50 shown in FIG. 5, the tip 63 of the optical probe 52 is brought close to an object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage to be measured can be effectively detected by the detector 50 without bringing the optical probe 52 into contact with such fine-line portions.

The voltage detector 50, however, has its own problems. First, the state of polarization of a light beam issuing from the polarizer 54 changes as it passes through the optical fiber and thereby the input light launched into the electro-optic material 62 contains a polarized component in addition to the linearly polarized component extracted by the polarizer 54. Secondly, the state of polarization of output light that emerges from the electro-optic material 62 after being reflected from the thin metal film 65 is also distorted as it passes through the optical fiber 51 and the output light entering the analyzer 57 contains a polarized component that is unwanted for voltage detection purposes.

For the reasons stated above, it is difficult to extract in the analyzer 57 and the photoelectric converter 58 the polarized component that is dependent solely on the change in the state of polarization that has occurred in the electro-optic material 62 in the optical probe 52, and this difficulty has reduced the detection precision attainable by the system shown in FIG. 5.

SUMMARY OF THE INVENTION

An object, therefore, of the present invention is to provide a voltage detector that is capable of extracting a polarized component that depends solely on the change in the state of light polarization that takes place in the electro-optic material in an optical probe.

This object of the present invention can be attained by a voltage detector of the type that employs an electro-optic material whose refractive index changes according to the voltage developing in a selected area of an object to be measured and which comprises: a light source for emitting a light beam; a guide means for guiding the light beam from said light source; a splitting and extracting means that selectively extracts a light beam having a predetermined polarized component from the light beam from said guide means, thereby splitting it into reference light and input light to be launched into said electro-optic material, and which splits the light emerging from said electro-optic material so as to selectively extract emerging light having a predetermined polarized component; and a detection means for detecting the voltage on the object of interest on the basis of the intensity of the reference light obtained by splitting with said splitting and extracting means and the intensity of the output light extracted by said means.

In the voltage detector of the present invention, a light beam issuing from the light source is launched into the splitting and extracting means via the guide means. The splitting and extracting means selectively extracts a light beam having a predetermined polarized component from the light beam issuing from the guide means, thereby splitting it into reference light and input light to be launched into the electro-optic material. The input light beam having a predetermined polarized component which is extracted by the splitting and extracting means is directly launched into the electro-optic material without passing through any guide means such as an optical fiber. Therefore, the state of polarization of the light launched into the electro-optic material is substantially the same as that of polarization of the light extracted with the splitting and extracting means. The light launched into the electro-optic material travels through this material whose refractive index has changed in response to the voltage in a selected area of the object to be measured. Thereafter, the light is reflected from the tip of the electro-optic material, travels through the return path, and emerges from said material. The state of polarization of the output light emerging from the electro-optic material has been changed as a result of the change in the refractive index of said material. The output light emerging from the electro-optic material directly enters the splitting and extracting means without passing any guide means such as an optical fiber, so that state of polarization of an output light that enters the splitting and extracting means is substantially the same as that of polarization attained when said light was just outputted from the electro-optic material.

As a consequence, the difference between the state of polarization of light launched from the splitting and extracting means into the electro-optic material and the state of polarization of the output light that emerges from the electro-optic material and which enters the splitting and extracting means is in almost exact correspondence to the amount of change in the state of polarization that took place in the electro-optic material. This amount of change in the state of polarization reflects the amplitude of the voltage developing in a selected area of the object to be measured, so one is able to detect this voltage by extracting output light having a predetermined polarized component through the splitting and extracting means, then determining the intensity of the extracted light as well as that of reference light, and by finally feeding the determined intensities of the two kinds of light into the detection means. If desired, a laser diode that produces a light beam of a very small pulse width may be used as a light source and a photoelectric converter used as a detection means. With this design, rapid changes in the voltage on the object to be measured can be sampled at extremely short time intervals. Rapid changes in the voltage on the object of interest can be measured with a very high time resolution by using a CW (Continuous Wave) light source and a quick-response detector such as a streak camera. Either method is capable of precise detection of rapid changes in voltage.

DETAILED DESCRIPTION OF THE PREFERRED EMBODIMENTS

Various embodiments of the present invention are described hereinafter with reference to the accompanying drawings.

Figure 1:
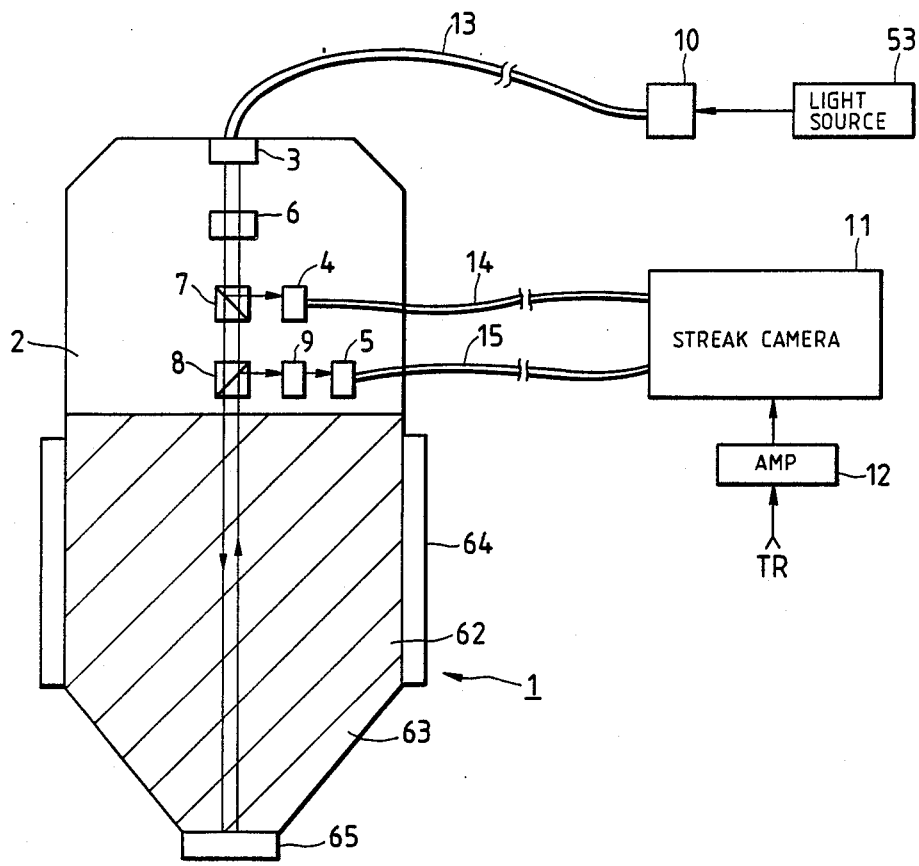
FIG. 1 is a diagram showing the composition of a voltage detector according to one embodiment of the present invention.

FIG. 1 is a diagram showing the composition of a voltage detector according to one embodiment of the present invention.

The voltage detector generally indicated by 1 in FIG. 1 has the following components additionally installed in an optical probe 2: a collimator 3; condenser lenses 4 and 5; a polarizer 6 that selectively extracts a light beam having a predetermined polarized component from the light beam issuing from the collimator 3; a beam splitter 7 that splits the polarized light beam from the polarizer 6 into two components one of which is directed as input light toward an electro-optic material 62 and the other being directed as reference light toward the condenser lens 4; a beam splitter 8 that splits output light emerging from the electro-optic material 62; and an analyzer 9 that selectively extracts a predetermined polarized component from the split output light and allows it to be launched into the condenser lens 5.

A light beam issuing from a light source 53 passes through a condenser lens 10 and an optical fiber 13 and is collimated with the collimator 3 in the optical probe 2 before it is guided to the polarizer 6. The reference light from the condenser lens 4 in the probe 2 and the output light from the condenser lens 5 travel through optical fibers 14 and 15, respectively, and are projected onto a slit 41 in a streak camera 11 as shown in FIG. 2.

Figure 2:
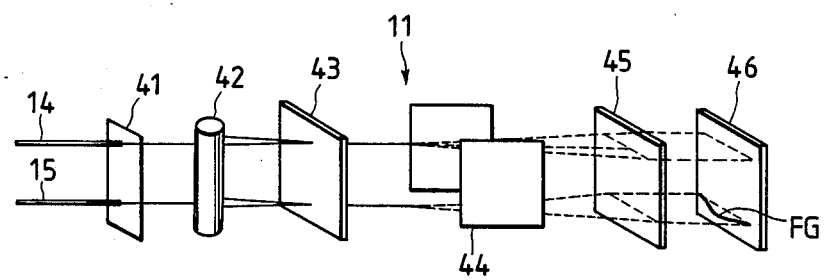
FIG. 2 is a schematic diagram of a streak camera.

The composition of the streak camera 11 is shown in FIG. 2 and consists of the following: a slit 41 on which the reference light and output light coming through the optical fibers 14 and 15 are projected; a condenser lens 42 into which the reference light and output light that have passed through the slit 41 are launched; a photoelectric screen 43 onto which the reference light and output light condensed by the lens 42 are projected; deflection electrodes 44 that horizontally deflect the electron beam emitted from the photoelectric screen 43; a microchannel plate 45 that multiplies the electrons in the deflected beam; and a phosphor screen 46 on which the electron beam from the microchannel plate 45 impinges. In FIG. 2, the microchannel plate 45 is shown to be separate from the phosphor screen 46 but they are usually coupled in a single unit in a practical system. The condenser lens 42 is shown to be cylindrical but usually this is not so in practice. The deflection electrodes 44 in the streak camera 11 are supplied with a sawtooth voltage from an amplifier 12 in synchronism with a trigger signal TR, so that the reference light and output light impinging on the photoelectric screen 43 on a time basis can be swept horizontally across the phosphor screen 46. As a result, the change in the voltage in a selected area of an object to be measured can be detected as a one-dimensional distribution of light intensity FG on the phosphor screen 46, with the horizontal direction or sweep direction serving as the time basis. The streak camera 11 may be of any conventional type such as a synchroscan streak camera, a streak camera using a sampling streak tube, a double-sweep streak camera, or a synchroscan streak camera fitted with a synchronous blanking unit. These streak cameras offer the advantage that even voltages such as a single pulse voltage that will not change periodically can be detected with high precision.

Figure 5:
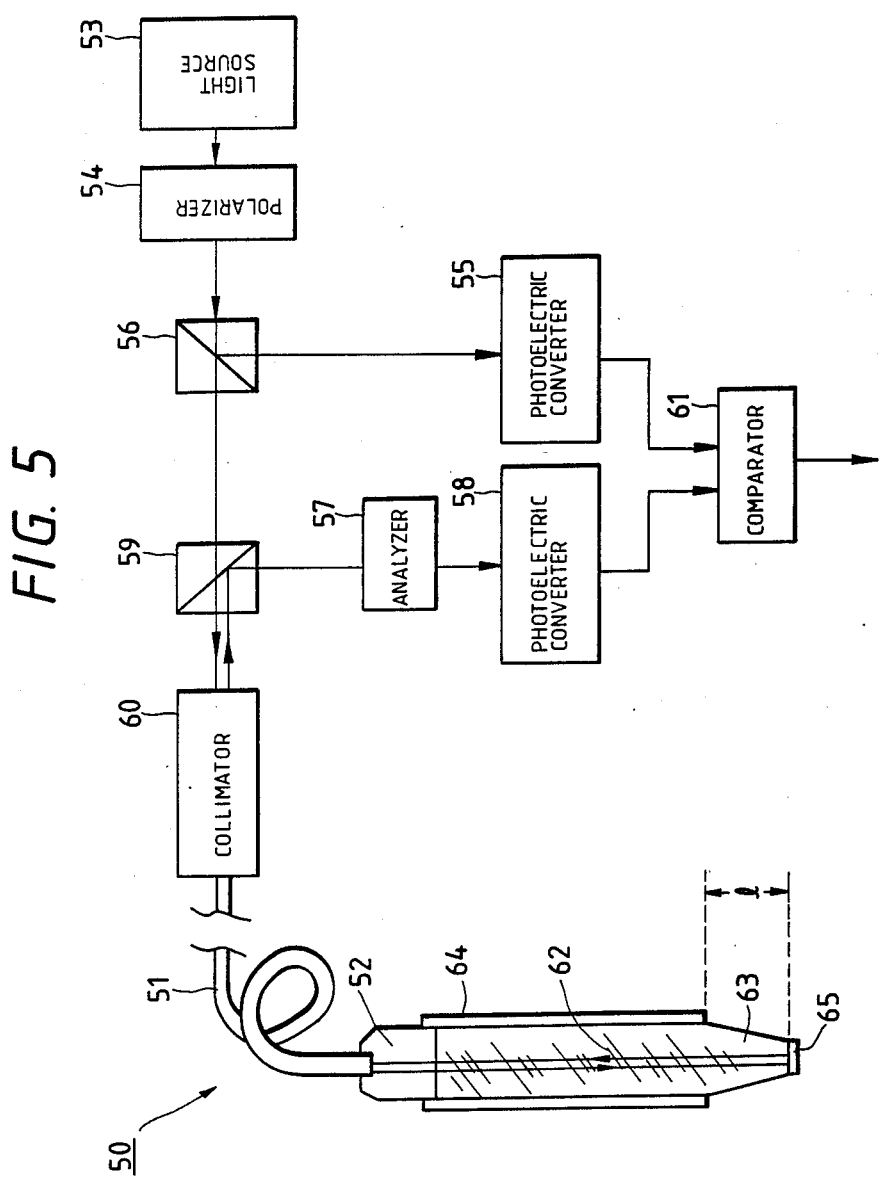
FIG. 5 is a diagram showing the composition of a voltage detector which has been proposed in Japanese Patent Application No. 280498/1986.

In the voltage detector 1 having the composition described above, a light beam issuing from the CW light source 53 such as a laser diode passes through the condenser lens 10 and the optical fiber 13 and then enters the collimator 3 in the optical probe 2. The light beam goes on to pass through the polarizer 6 which extracts a light beam of intensity I that is solely composed of a predetermined polarized component and the extracted light beam is introduced into the beam splitter 7. As with the beam splitter 56 shown in FIG. 5, the light beam entering the beam splitter 7 is split into two components, one of which is guided as reference light toward the condenser lens 4 and the other is directed as input light toward the beam splitter 8. The resulting reference light has an intensity of I/2.

The reference light condensed with the lens 4 travels through the optical fiber 14 and is launched into the streak camera 11. The input light passing through the beam splitter 8 is launched into the electro-optic material 62.

In the embodiment shown in Fig. 1, the light beam coming from the polarizer 6 is passed through the beam splitters 7 and 8, and thence launched directly into the electro-optic material 62 without passing through any guide means such as an optical fiber. Therefore, the input light, as it is launched into the electro-optic material 62, retains the state of polarization of the light that emerges from the polarizer 6.

As already described in the foregoing, the state of polarization of the input light launched into the electro-optic material 62 changes at the tip 63 on account of the potential difference between the thin metal film 65 and the conductive electrode 64. After reaching the thin metal film 65, the light is reflected therefrom and experiences a further change in the state of its polarization before it emerges from the electro-optic material 62 and travels back to the beam splitter 8. The beam splitter 8 splits the output light into two components, one of which is directed into the analyzer 9. Since the output light from the beam splitter 8 is directly introduced into the analyzer 9 without passing through any guide means such as an optical fiber, the output light incident upon the analyzer 9 retains the state of polarization it had when it was produced from the electro-optic material 62. The analyzer 9 selectively extracts a predetermined polarized component from the output light that emerged from the electro-optic material 62 after experiencing a change in the state of polarization. The extracted light passes through the condenser lens 5 and the optical fiber 15 and thence is launched into the streak camera 11. Therefore, if the analyzer 9 is designed in such a way that it exclusively transmits a light beam having a polarized component perpendicular to that extracted with the polarizer 6, the output light picked up by the analyzer 9 will have an intensity of $(I/8)\sin^2[(\pi/2)V/V_0]$.

As will be understood from the foregoing explanation, the optical fiber 13 is used in the embodiment shown in FIG. 1 for the purpose of transmitting the intensity of light beam from the light source 53 to the polarizer 6, and the optical fibers 14 and 15 are used to transmit the intensities of reference light and reflected light, respectively, to the streak camera 11. In other words, the optical fibers 13, 14 and 15 are not intended to transmit information about the state of light polarization. Therefore, the streak camera 11 is capable of faithful detection of the voltage resulting from the change in the state of polarization that occurs in the electro-optic material 62. Stated more specifically, the input light from the polarizer 6 is launched into the electro-optic material 62 without experiencing any change in the state of polarization, and the output light emerging from the electro-optic material 62 is also introduced into the analyzer 9 without experiencing any change in the state of polarization. This enables the extraction of a polarized component solely dependent on the change in the state of polarization that occurs in the electro-optic material 62, thereby leading to highly precise detection of the voltage developing in an object being measured.

In the voltage detector 1 shown in FIG. 1, two beam splitters 7 and 8 are used to extract the reference light and the output light, respectively. As a result, the output light that enters the analyzer 9 is weak and its intensity is only about a quarter of the intensity of the reference light. This has been a limiting factor on the objective of accomplishing voltage detection with an even higher level of precision.

Figure 3:
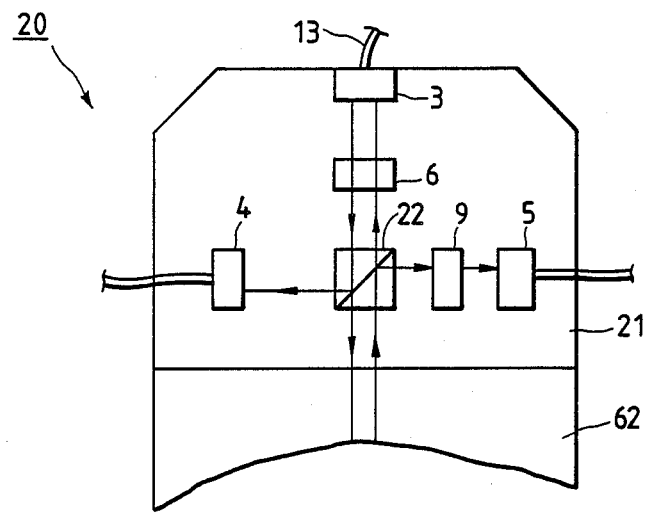
FIG. 3 is a diagram showing a modification of the voltage detector shown in FIG. 1.

In order to attain this objective, the voltage detector shown in FIG. 1 may be modified as depicted in FIG. 3. The voltage detector generally indicated by 20 in FIG. 3 contains a single beam splitter 22 in an optical probe 21. This beam splitter 22 has two capabilities; firstly, it receives a light beam having a predetermined polarized component from the polarizer 6 and splits it into reference light and the input light to be launched into the electro-optic material 62; secondly, it allows the output light emerging from the electro-optic material 62 to be introduced into the analyzer 9.

When a light beam of intensity I having a predetermined polarized component that is produced from the polarizer 6 is introduced into the beam splitter 22 in the voltage detector 20 shown in FIG. 3, the splitter 22 splits the light beam into two components, one of which is directed as reference light toward the collimator 4 and the other is launched as input light into the electro-optic material 62. Each of the reference light and the input light has an intensity of I/2. The light launched into the electro-optic material 62 undergoes a change in the state of its polarization as it makes a round trip through the material 62. It then emerges from the material 62 and travels back to the beam splitter 22, where it is split into two components, one of which is introduced into the analyzer 9. The output light introduced into the analyzer 9 has an intensity of I/4, which is one half the intensity of the reference light. Therefore, the intensity of the output light that is produced in the voltage detector shown in FIG. 3 is increased to about twice the level that can be attained in the detector 1 shown in FIG. 1. The voltage detector 20 shown in FIG. 3 has the additional advantage that the optical probe 21 is simple in structure and small in size by virtue of the use of a single beam splitter 22, which contributes to improvement in the precision of the optical system employed.

Figure 4:
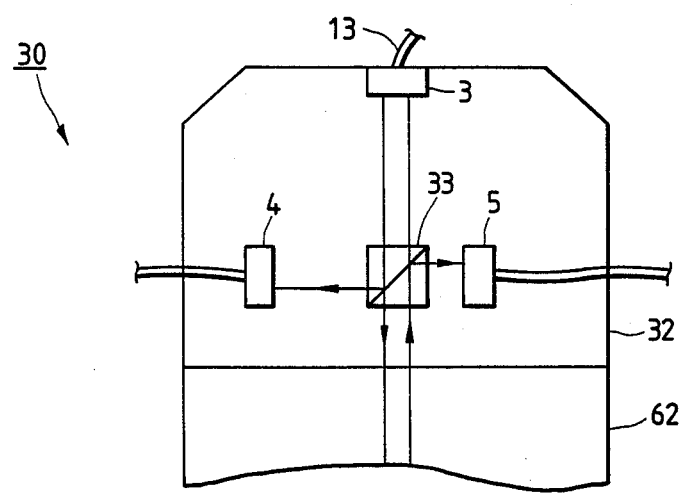
FIG. 4 is a diagram showing another modification of the voltage detector shown in FIG. 1.

FIG. 4 shows another modification of the voltage detector shown in FIG. 1. The voltage detector generally indicated by 30 in FIG. 4 contains a single polarizing beam splitter 33 in an optical probe 32. This polarizing beam splitter 33 not only serves as a beam splitter but also has the capabilities of the polarizer 6 and analyzer 9 shown in FIG. 3.

When a light beam enters the polarizing beam splitter 33 in the voltage detector 30 having the construction described above, the beam splitter 33 splits the beam into two components, one being reference light having a predetermined polarized component and the other being a light beam which has a polarized component perpendicular to that of the reference light and which is to be launched into the electro-optic material 62. The output light emerging from the electro-optic material 62 after having experienced a change in the state of polarization is also introduced into the beam splitter 33, which selectively extracts a light beam having the same polarized component as that of the reference light. The so split output light is sent to the condenser lens 5.

The voltage detector 30 shown in FIG. 4 incorporates in the polarizing beam splitter 33 both the capabilities of the polarizer 6 and the analyzer 9 used in the detector shown in FIG. 3, and this offers the additional advantage of further reducing the number of components in the probe as compared with the system shown in FIG. 3.

If the voltage developing in a selected area of an object to be measured is of low level, the change that can be caused in the state of polarization is small and any positional misalignment between the polarizer 6 and the analyzer 9 can produce significant effects on the precision of detection. However, in the detection system shown in FIG. 4, the polarizer 6 and the analyzer 9 are integrated as a unit in the polarizing beam splitter 33, and there is no possibility that misalignment occurs between the polarizer 6 and the analyzer 9 or that either one of these components makes an unwanted turn. As a result, the system shown in FIG. 4 enables not only a high voltage but also a very low voltage to be detected with high precision.

The embodiments shown in FIGS. 1, 3 and 4 refer to the case where rapid changes in the voltage developing in an object to be measured are detected with an extremely high time resolution by using a CW light source as the light source 53 and the streak camera 11 as the detector. Alternatively, as in the case of the system shown in FIG. 5, a laser diode that produces a light beam of a very small pulse width may be used as the light source 53 and a photoelectric converter as the detector with a view to sampling the rapid changes in voltage at extremely short time intervals.

The foregoing embodiments also assume that the polarized component extracted with the analyzer 9 is perpendicular to that extracted with the polarizer 6. It should, however, be noted that these two polarized components may be parallel to each other and in this case the output light picked up by the analyzer 9 will have an intensity of $(I/8)\cos^2[(\pi/2)V/V_0]$. If desired, the two polarized components may have such a spatial relationship that they are inclined with respect to each other at a desired angle. In practical applications, it is recommended that each of the optical probes 2, 21 and 32 is provided with a black coating on their inner surface in order to prevent scattering of an incident light beam.

As described on the foregoing pages, the voltage detector of the present invention is so designed that input light coming from the splitting and extracting means is directly launched into the electro-optic material without passing through any guide means, and that the output light emerging from the electro-optic material is also introduced into the same splitting and extracting means without passing through any guide means. Thee fore, a polarized component that is solely dependent on the change in the state of polarization occurring in the electro-optic material can be extracted so as to improve the precision of the voltage detection.

What is claimed is:

1. A voltage detector for detecting a voltage developing in a selected area of an object to be measured, comprising:
   a pulse light source for emitting a pulse light beam;
   first guide means for guiding said light beam from said pulse light source;
   a voltage-sensing part including an electro-optic material whose refractive index changes according to said voltage developing in said selected area of said object;
   splitting and extracting means for extracting a light beam with a first predetermined polarized component from said light beam guided from said first guide means, splitting said light beam with said first predetermined polarized component into a reference light beam and an input light beam which is launched into said electro-optic material, splitting an output light beam emerging from said electro-optic material, and extracting an output light beam with a second predetermined polarized component from one of the split output light beams;
   second guide means for guiding said reference light beam and said output light beam with said second predetermined polarized component; and
   detection means for determining said voltage developing in said selected area of said object, said detecting means including a first photoelectric converter for detecting intensity of said reference light beam guided from said second guide means and a second photoelectric converter for detecting said output light beam with said predetermined polarized component guided from said second guide means.

2. A voltage detector as claimed in claim 1, wherein said splitting and extracting means comprises:
   a polarizer for extracting said light beam with said first predetermined polarized component from said light beam guide from said first guide means;
   a beam splitter for splitting said light beam with said first predetermined polarized component into said reference light beam and said input light beam and also for splitting said output light beam emerging from said electro-optic material; and
   an analyzer for extracting said output light beam with said second predetermined polarized component from one of said split output light beams.

3. A voltage detector as claimed in claim 1, wherein said splitting and extracting means comprises a polarizing beam splitter.

4. A voltage detector for detecting a voltage developing in a selected area of an object to be measured, comprising:
   a continuous wave light source for emitting a continuous wave light beam;
   first guide means for guiding said light beam from said continuous wave light source;
   a voltage-sensing part including an electro-optic material whose refractive index changes according to said voltage developing in said selected area of said object;
   splitting and extracting means for extracting a light beam with a first predetermined polarized component from said light beam guided from said first guide means, splitting said light beam with said first predetermined polarized component into a reference light beam and an input light beam which is launched into said electro-optic material, splitting an output light beam emerging from said electro-optic material, and extracting an output light beam with a second predetermined polarized component from one of the split output light beams;
   second guide means for guiding said reference light beam and said output light beam with said predetermined polarized component; and
   detection means for determining said voltage developing in a selected area of said object, said detection means including a quick-response detector for detecting intensities of said reference light beam and said output light beam with said second predetermined polarized component guided from said second guide means.

5. A voltage detector as claimed in claim 4, wherein said quick-response detector is a streak camera.

6. A voltage detector as claimed in claim 1, 5 or 4 wherein said first guide means and second guide means are optical fibers.

7. A voltage detector as claimed in claim 1, 5 or 4 wherein said voltage-sensing part and said splitting and extracting means are directly connected to each other to form an optical probe.

8. A voltage detector as claimed in claim 1, 5 or 4 wherein said splitting and extracting means comprises:
   a polarizer for extracting said light beam with said first predetermined polarized component from said light beam guided from said first guide means;
   a first beam splitter for splitting said light beam with said first predetermined polarized component into said reference light beam and said input light beam;
   a second beam splitter for splitting said output light beam emerging from said electro-optic material; and
   an analyzer for extracting said output light beam with said second predetermined polarized component from one of said split output light beams.

* * * * *